(12) United States Patent
Yang et al.

(10) Patent No.: US 10,607,684 B2
(45) Date of Patent: Mar. 31, 2020

(54) SEMICONDUCTOR DEVICES

(71) Applicant: SK hynix Inc., Icheon-si Gyeonggi-do (KR)

(72) Inventors: Seung Min Yang, Guri-si (KR); Kyoung Youn Lee, Cheongju-si (KR); Byeong Cheol Lee, Seoul (KR); Don Hyun Choi, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/212,407

(22) Filed: Dec. 6, 2018

(65) Prior Publication Data

US 2020/0013450 A1    Jan. 9, 2020

(30) Foreign Application Priority Data

Jul. 3, 2018 (KR) ..................... 10-2018-0077231

(51) Int. Cl.
| | | |
|---|---|---|
| *G11C 7/04* | (2006.01) | |
| *G11C 11/4076* | (2006.01) | |
| *G11C 11/408* | (2006.01) | |
| *G11C 11/406* | (2006.01) | |
| *H03K 19/20* | (2006.01) | |

(52) U.S. Cl.
CPC ...... *G11C 11/4076* (2013.01); *G11C 11/4082* (2013.01); *G11C 11/40615* (2013.01); *H03K 19/20* (2013.01)

(58) Field of Classification Search
CPC .......... G11C 11/4076; G11C 11/40615; G11C 11/4082
USPC ..................................... 365/189.05
See application file for complete search history.

(56) References Cited

U.S. PATENT DOCUMENTS

| | | | |
|---|---|---|---|
| 7,379,355 B2 * | 5/2008 | Kim .............. | G11C 7/02 365/194 |
| 9,287,858 B1 | 3/2016 | Singhal | |

FOREIGN PATENT DOCUMENTS

KR      100655084 B1    12/2006

* cited by examiner

*Primary Examiner* — Xiaochun L Chen
(74) *Attorney, Agent, or Firm* — William Park & Associates Ltd.

(57) ABSTRACT

A semiconductor device includes a delay time adjustment circuit and an address input circuit. The delay time adjustment circuit adjusts a point in time when charges are supplied to internal nodes according to a voltage level of a back-bias voltage in response to a test mode signal. The delay time adjustment circuit also delays an active signal by a first delay time varying according to amounts of charge of the internal nodes to generate a bank selection signal. The address input circuit is driven by the back-bias voltage. The address input circuit receives an address in response to the bank selection signal to generate an internal address. The address input circuit delays the address by a second delay time varying according to a voltage level of the back-bias voltage.

20 Claims, 9 Drawing Sheets

US 10,607,684 B2

SEMICONDUCTOR DEVICES

CROSS-REFERENCE TO RELATED APPLICATIONS

The present application claims priority under 35 U.S.C. 119(a) to Korean Application No. 10-2018-0077231, filed on Jul. 3, 2018, which is incorporated herein by reference in its entirety.

BACKGROUND

1. Technical Field

Embodiments of the present disclosure relate to semiconductor devices performing a self-refresh operation according to an address while a bank selection signal is generated in a power-down mode.

2. Related Art

In general, two or more semiconductor devices may be packaged to provide a package product. Each of the semiconductor devices may receive various signals from an external device through input pads and input circuits or may output internal signals through output pads and output circuits.

Delay times of the transmission paths through which the signals are transmitted may be set to be different according to characteristics of the transmission paths. In addition, synchronous semiconductor devices such as synchronous dynamic random access memory (SDRAM) devices may be synchronized with a clock signal to receive or output the signals, and delay times of the signals may be set to be different according to variations of processes, voltages, and/or temperatures (PVT). Thus, it may be necessary to appropriately adjust the delay times of the signals inputted to or outputted from the semiconductor devices.

SUMMARY

In accordance with the present teachings, a semiconductor device includes a delay time adjustment circuit and an address input circuit. The delay time adjustment circuit adjusts a point in time when charges are supplied to internal nodes according to a voltage level of a back-bias voltage in response to a test mode signal. The delay time adjustment circuit also delays an active signal by a first delay time varying according to amounts of charge of the internal nodes to generate a bank selection signal. The address input circuit is driven by the back-bias voltage. The address input circuit receives an address in response to the bank selection signal to generate an internal address. The address input circuit delays the address by a second delay time varying according to a voltage level of the back-bias voltage.

Also in accordance with the present teachings, a semiconductor device includes a delay time adjustment circuit and an address input circuit. The delay time adjustment circuit delays a point in time when charges are supplied to internal nodes in response to the back-bias voltage whose voltage level increases in a power-down mode. The delay time adjustment circuit also delays an active signal by a first delay time varying according to amounts of charge of the internal nodes to generate a bank selection signal. The address input circuit is driven by the back-bias voltage. The address input circuit receives an address in response to the bank selection signal to generate an internal address. Moreover, the address input circuit delays the address by a second delay time varying according to a voltage level of the back-bias voltage.

DETAILED DESCRIPTION OF THE EMBODIMENTS

Various embodiments of the present disclosure are described hereinafter with reference to the accompanying drawings. However, the embodiments described herein are for illustrative purposes only and are not intended to limit the scope of the present disclosure.

Figure 1:
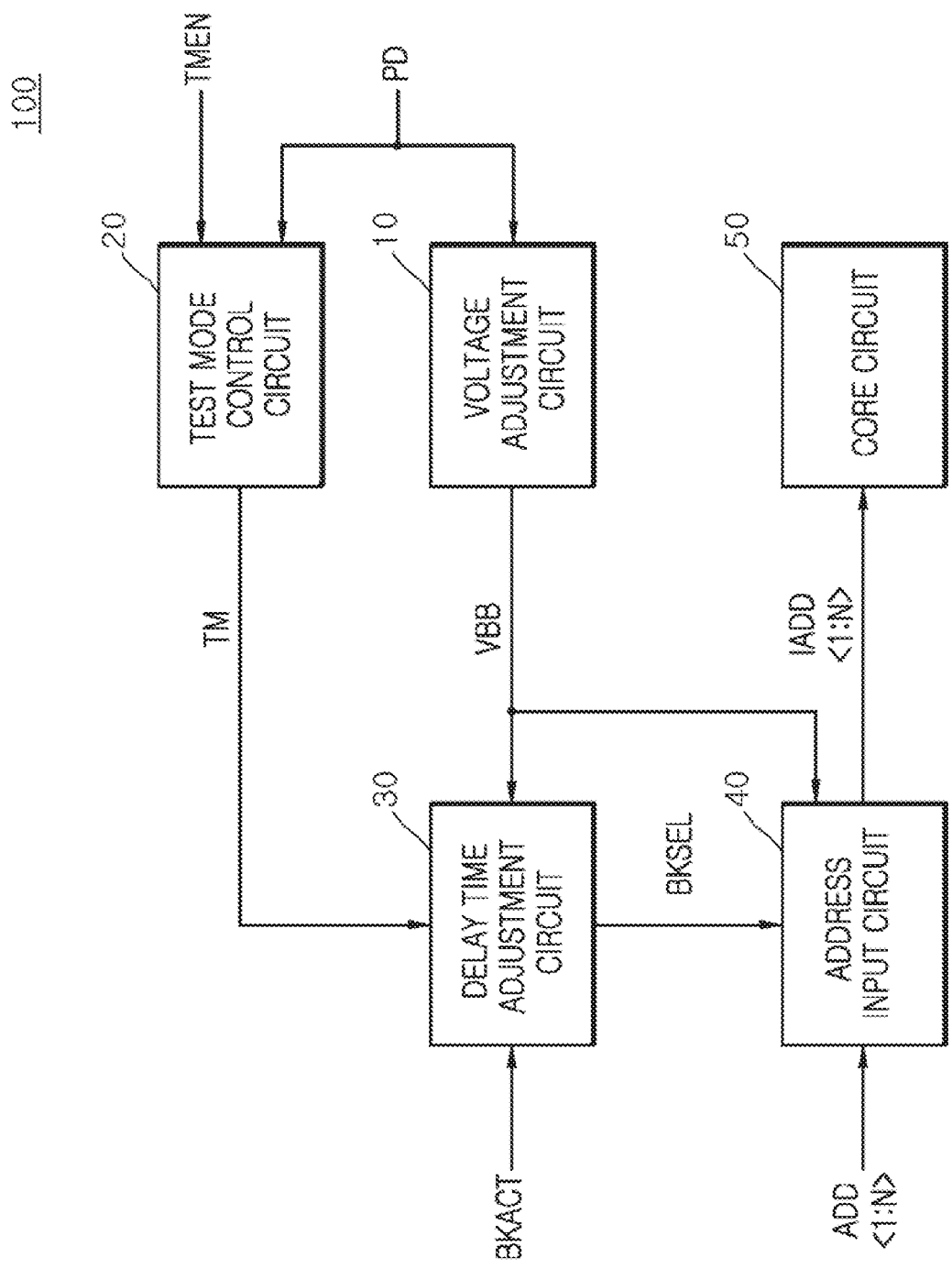
FIG. 1 shows a block diagram illustrating a configuration of a semiconductor device according to an embodiment of the present disclosure.

As illustrated in FIG. 1, a semiconductor device 100 according to an embodiment may include a voltage adjustment circuit 10, a test mode control circuit 20, a delay time adjustment circuit 30, an address input circuit 40, and a core circuit 50.

The voltage adjustment circuit 10 may adjust a voltage level of a back-bias voltage VBB in response to a power-down signal PD. The voltage adjustment circuit 10 may adjust a voltage level of the back-bias voltage VBB if the power-down signal PD is enabled to have a logic "high" level. The voltage adjustment circuit 10 may generate the back-bias voltage VBB whose voltage level increases if the power-down signal PD is enabled to have a logic "high" level. The power-down signal PD may be enabled to put the semiconductor device 100 in a power-down mode. A logic level of the enabled power-down signal PD may be set as a logic "high" level or a logic "low" level according to embodiment.

As used herein, a signal, such as the power-down signal PD, having a logic "low" level distinguishes from the signal when it has a logic "high" level. For example, the high level may correspond to the signal having a first voltage, and the low level may correspond to the signal having a second voltage. For some embodiments, the first voltage is greater than the second voltage. In other embodiments, different characteristics of a signal, such as frequency or amplitude, determine whether the signal has a high level or a low level. For some cases, the high and low levels of a signal represent logical binary states.

The test mode control circuit 20 may generate a test mode signal TM in response to the power-down signal PD and a test enablement signal TMEN. The test mode control circuit 20 may generate the test mode signal TM which is enabled to have a logic "high" level if the power-down signal PD is enabled to have a logic "high" level and the test enablement signal TMEN is enabled to have a logic "high" level. The test enablement signal TMEN may be enabled to put the semiconductor device 100 in a test mode for controlling a point in time when a bank selection signal BKSEL is generated to latch addresses in the power-down mode. A logic level of the enabled test mode signal TM may be set as a logic "high" level or a logic "low" level according to embodiment.

The delay time adjustment circuit 30 may adjust a point in time when charges are supplied to internal nodes (nd31 and nd32 of FIG. 5) according to a voltage level of the back-bias voltage VBB in response to the test mode signal TM. The delay time adjustment circuit 30 may delay a point in time when charges are supplied to the internal nodes (nd31 and nd32 of FIG. 5) in response to the back-bias voltage VBB whose voltage level increases in the power-down mode. The delay time adjustment circuit 30 may delay an active signal BKACT by a first delay time varying according to amounts of charge of the internal nodes (nd31 and nd32 of FIG. 5), thereby generating the bank selection signal BKSEL. The first delay time increase in proportion to a voltage level of the back-bias voltage VBB.

The address input circuit 40 may be driven by the back-bias voltage VBB. The address input circuit 40 may receive an address ADD<1:N> in response to the bank selection signal BKSEL to generate an internal address IADD<1:N>. The address input circuit 40 may vary a second delay time by which the address ADD<1:N> is delayed according to a voltage level of the back-bias voltage VBB. The address input circuit 40 may delay the address ADD<1:N> by the second delay time to generate the internal address IADD<1:N>. The address ADD<1:N> may be set as a signal that is counted (also referred to as sequentially counted) to sequentially activate a plurality of word lines (not shown) included in the core circuit 50 during a self-refresh operation in the power-down mode. The address ADD<1:N> may be set as a signal provided by an external device to activate the plurality of word lines (not shown) included in the core circuit 50. The second delay time increase in proportion to a voltage level of the back-bias voltage VBB.

The core circuit 50 may include the plurality of word lines (not shown) and a plurality of memory cells (not shown) connected to the plurality of word lines. The core circuit 50 may sequentially activate the plurality of word lines in response to the internal address IADD<1:N> that is counted during the self-refresh operation in the power-down mode. The core circuit 50 may activate the memory cells in response to the internal address IADD<1:N>. The core circuit 50 may store data into the activated memory cells or may output data stored in the activated memory cells.

Figure 2:
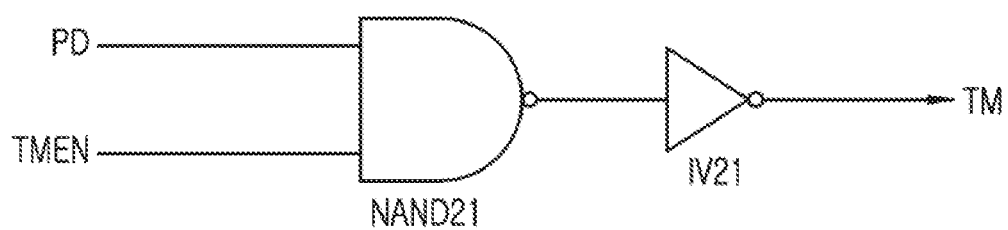
FIG. 2 shows a circuit diagram illustrating a configuration of a test mode control circuit included in the semiconductor device of FIG. 1.

Referring to FIG. 2, the test mode control circuit 20 may include a NAND gate NAND21 and an inverter IV21.

The test mode control circuit 20 may generate the test mode signal TM which is enabled in response to the power-down signal PD and the test enablement signal TMEN. The test mode control circuit 20 may perform a logical AND operation of the power-down signal PD and the test enablement signal TMEN to generate the test mode signal TM. The test mode control circuit 20 may generate the test mode signal TM which is enabled to have a logic "high level if the power-down signal PD has a logic "high" level and the test enablement signal TMEN has a logic "high" level.

Figure 3:
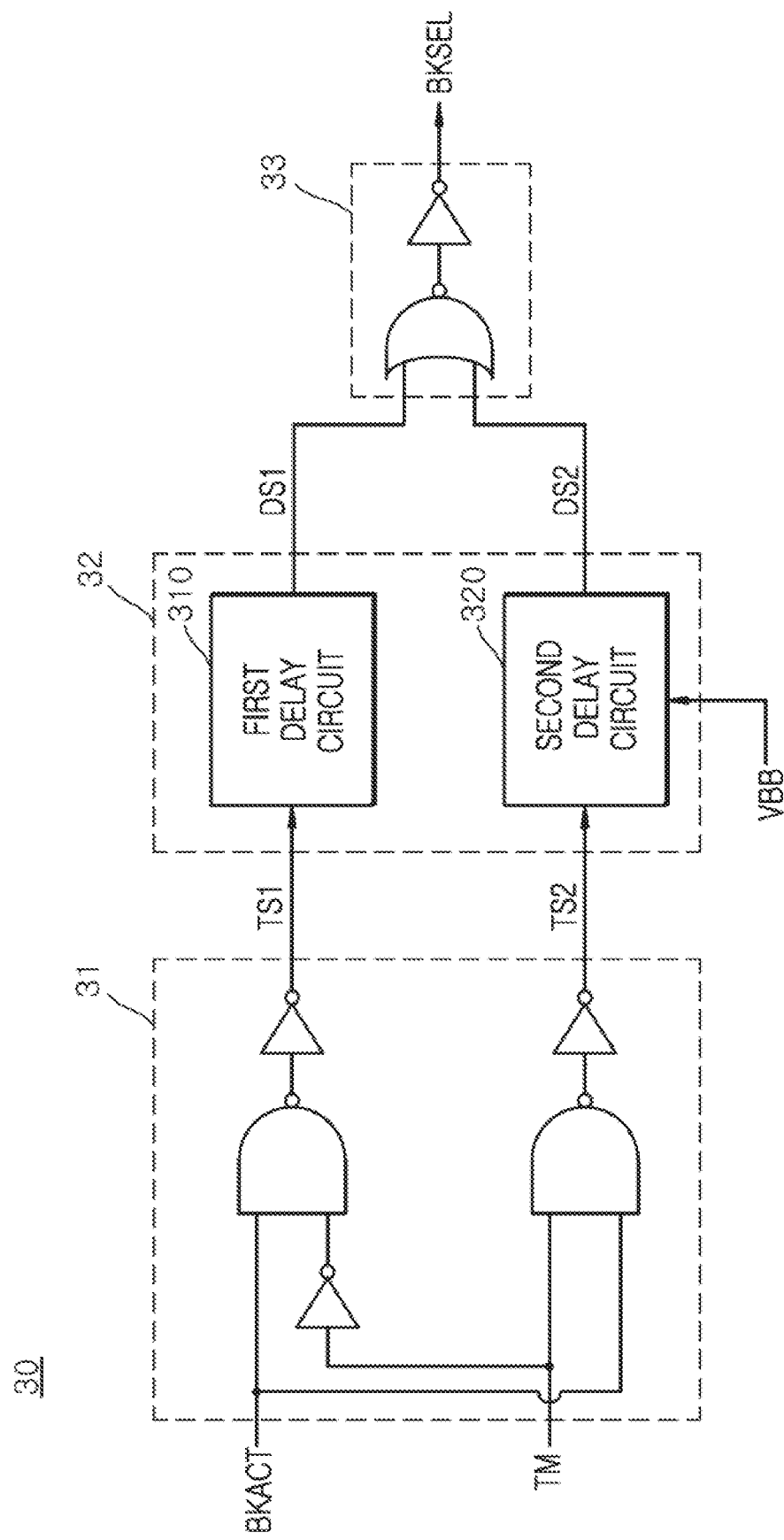
FIG. 3 shows a circuit diagram illustrating a configuration of a delay time adjustment circuit included in the semiconductor device of FIG. 1.

Referring to FIG. 3, the delay time adjustment circuit 30 may include a transmission signal generation circuit 31, a delay circuit 32, and a logic circuit 33.

The transmission signal generation circuit 31 may output the active signal BKACT as a first transmission signal TS1 or a second transmission signal TS2 in response to the test mode signal TM. The transmission signal generation circuit 31 may output the active signal BKACT as the first transmission signal TS1 if the test mode signal TM is disabled to have a logic "low" level. The transmission signal generation circuit 31 may output the active signal BKACT as the second transmission signal TS2 if the test mode signal TM is enabled to have a logic "high" level.

The delay circuit 32 may include a first delay circuit 310 and a second delay circuit 320.

The first delay circuit 310 may buffer the first transmission signal TS1 to generate a first delayed signal DS1. The first delay circuit 310 may delay the first transmission signal TS1 by a predetermined delay time to generate the first delayed signal DS1. The predetermined delay time of the first delay circuit 310 may be set differently for different embodiments. The word "predetermined" as used herein with respect to a parameter, such as a delay time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The second delay circuit 320 may buffer the second transmission signal TS2 to generate a second delayed signal DS2. A delay time of the second delay circuit 320 may be set according to a voltage level of the back-bias voltage VBB. The second delay circuit 320 may delay the second transmission signal TS2 by the first delay time to generate the second delayed signal DS2.

As described above, the delay circuit 32 may delay the first transmission signal TS1 by the predetermined delay time to generate the first delayed signal DS1. In addition, the delay circuit 32 may delay the second transmission signal TS2 by the first delay time, which is set according to a voltage level of the back-bias voltage VBB, to generate the second delayed signal DS2.

The logic circuit 33 may generate the bank selection signal BKSEL, which is enabled to have a logic "high" level if any one or both of the first and second delay signals DS1 and DS2 has a logic "high" level. The logic circuit 33 may perform a logical OR operation of the first and second delay signals DS1 and DS2 to generate the bank selection signal BKSEL.

Figure 4:
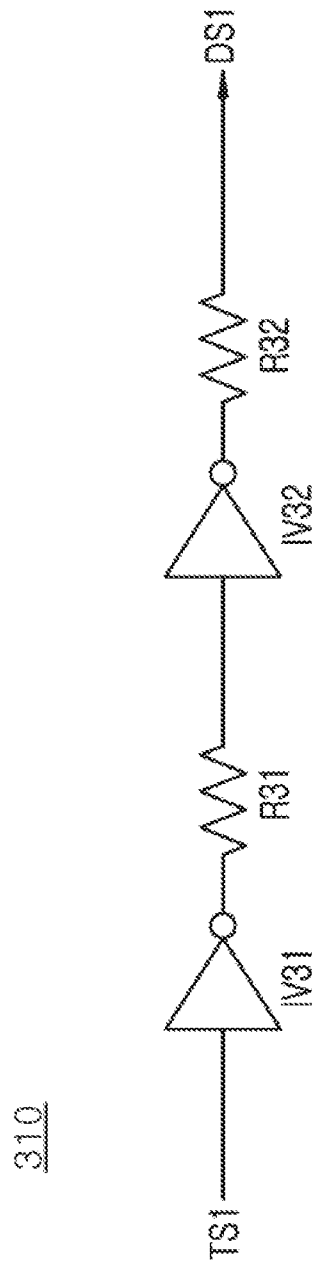
FIG. 4 shows a circuit diagram illustrating a configuration of a first delay circuit included in the delay time adjustment circuit of FIG. 3.

Referring to FIG. 4, the first delay circuit 310 may include inverters IV31 and IV32 and resistors R31 and R32.

The first delay circuit 310 may be realized using the inverter IV31, the resistor R31, the inverter IV32, and the resistor R32, which are sequentially cascaded. The first delay circuit 310 may delay the first transmission signal TS1 by a delay time set by the inverters IV31 and IV32 and the resistors R31 and R32 to generate the first delayed signal DS1. In some other embodiments, the first delay circuit 310 may be realized using an inverter chain comprised of a plurality of inverters that are cascaded.

Figure 5:
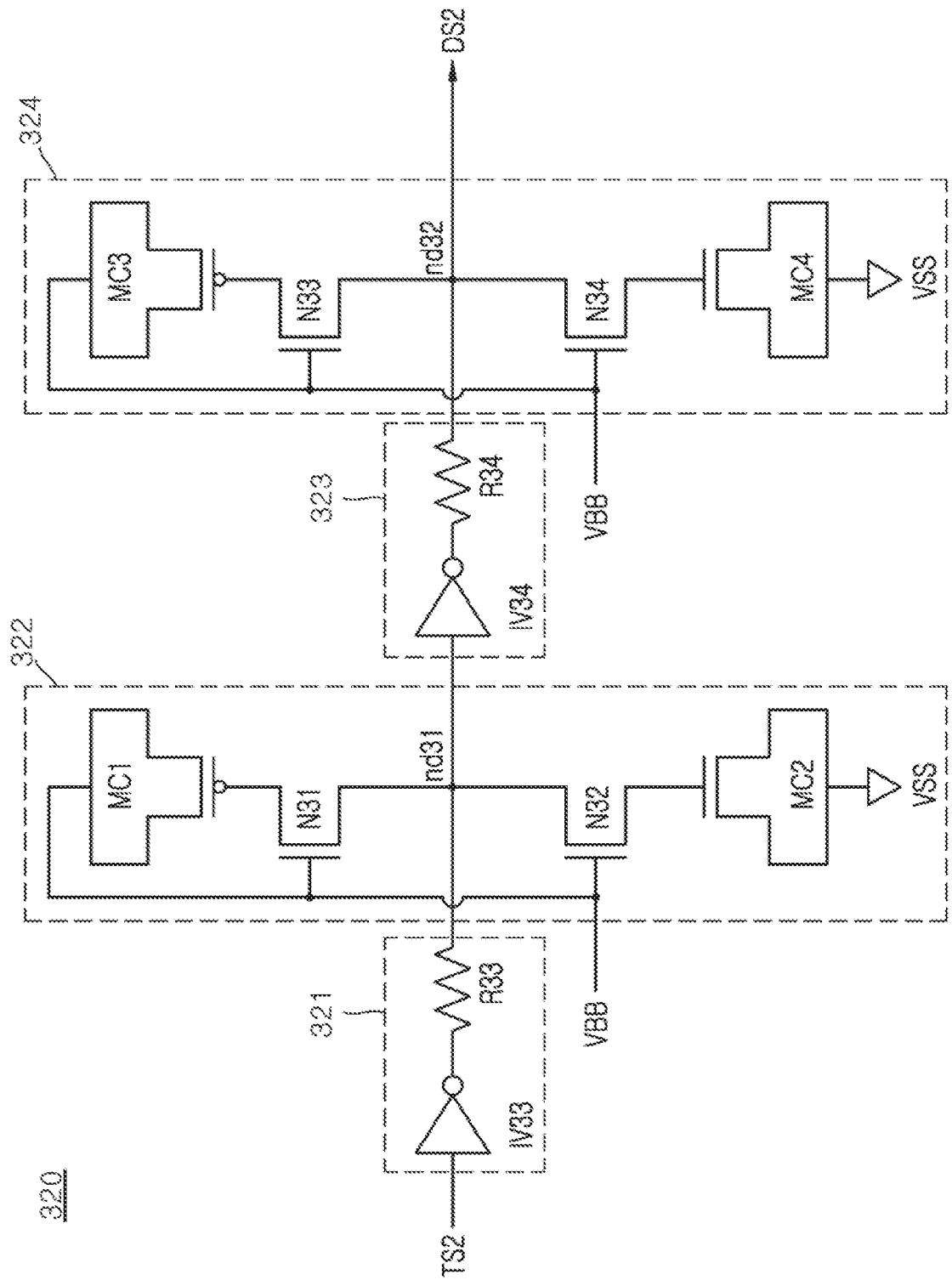
FIG. 5 shows a circuit diagram illustrating a configuration of a second delay circuit included in the delay time adjustment circuit of FIG. 3.

Referring to FIG. 5, the second delay circuit 320 may include a first buffer 321, a first charge supply circuit 322, a second buffer 323, and a second charge supply circuit 324.

The first buffer 321 may include an inverter IV33 and a resistor R33. The first buffer 321 may be realized using the inverter IV33 and the resistor R33, which are cascaded. The first buffer 321 may inversely buffer the second transmission signal TS2 to output the inversely buffered signal of the second transmission signal TS2 to the internal node nd31.

The first charge supply circuit 322 may include switching elements N31 and N32, a first capacitor MC1, and a second capacitor MC2. The switching element N31 may be coupled between the internal node nd31 and the first capacitor MC1 and may be turned on in response to the back-bias voltage VBB. The switching element N32 may be coupled between the internal node nd31 and the second capacitor MC2 and may be turned on in response to the back-bias voltage VBB. The first capacitor MC1 may be realized using a MOS-type capacitor. In such a case, a gate of the first capacitor MC1 may be connected to the switching element N31, and the back-bias voltage VBB may be used as a body voltage of the first capacitor MC1. The first capacitor MC1 may be realized using a PMOS transistor-type capacitor to control an amount of charge of the internal node nd31. In such a case, if the body voltage of the first capacitor MC1 positively increases, then a turn-on voltage of the first capacitor MC1 may negatively increase. The first capacitor MC1 may be turned on if a voltage level of the internal node nd31 increases to reach the turn-on voltage of the first capacitor MC1. If the turn-on voltage of the first capacitor MC1 negatively increases, then a turn-on time of the first capacitor MC1 may increase. The turn-on voltage of the first capacitor MC1 may correspond to a threshold voltage of a PMOS transistor having substantially the same configuration as the first capacitor MC1. The second capacitor MC2 may be realized using a MOS-type capacitor. In such a case, a gate of the second capacitor MC2 may be connected to the switching element N32, and a ground voltage VSS may be used as a body voltage of the second capacitor MC2. The second capacitor MC2 may be realized using an NMOS transistor-type capacitor to control an amount of charge of the internal node nd31.

As described above, the first charge supply circuit 322 may be connected to the internal node nd31 to control a charging time of the internal node nd31 according to the back-bias voltage VBB. The first charge supply circuit 322 may increase a charging time of the internal node nd31 if the back-bias voltage VBB positively increases.

The second buffer 323 may include an inverter IV34 and a resistor R34. The second buffer 323 may be realized using the inverter IV34 and the resistor R34, which are cascaded. The second buffer 323 may inversely buffer a signal of the internal node nd31 to output the inversely buffered signal of the signal of the internal node nd31 to the internal node nd32. The internal node nd32 may be a node through which the second delayed signal DS2 is outputted.

The second charge supply circuit 324 may include switching elements N33 and N34, a third capacitor MC3, and a fourth capacitor MC4. The switching element N33 may be coupled between the internal node nd32 and the third capacitor MC3 and may be turned on in response to the back-bias voltage VBB. The switching element N34 may be coupled between the internal node nd32 and the fourth capacitor MC4 and may be turned on in response to the back-bias voltage VBB. The third capacitor MC3 may be realized using a MOS-type capacitor. In such a case, a gate of the third capacitor MC3 may be connected to the switching element N33, and the back-bias voltage VBB may be used as a body voltage of the third capacitor MC3. The third capacitor MC3 may be realized using a PMOS transistor-type capacitor to control an amount of charge of the internal node nd32. In such a case, if the body voltage of the third capacitor MC3 positively increases, then a turn-on voltage of the third capacitor MC3 may negatively increase. The third capacitor MC3 may be turned on if a voltage level of the internal node nd32 increases to reach the turn-on voltage of the third capacitor MC3. If the turn-on voltage of the third capacitor MC3 negatively increases, then a turn-on time of the third capacitor MC3 may increase. The turn-on voltage of the third capacitor MC3 may correspond to a threshold voltage of a PMOS transistor having substantially the same configuration as the third capacitor MC3. The fourth capacitor MC4 may be realized using a MOS-type capacitor. In such a case, a gate of the fourth capacitor MC4 may be connected to the switching element N34, and the ground voltage VSS may be used as a body voltage of the fourth capacitor MC4. The fourth capacitor MC4 may be realized using an NMOS transistor-type capacitor to control an amount of charge of the internal node nd32.

As described above, the second charge supply circuit 324 may be connected to the internal node nd32 to control a charging time of the internal node nd32 according to the back-bias voltage VBB. The second charge supply circuit 324 may increase a charging time of the internal node nd32 if the back-bias voltage VBB positively increases.

Figure 6:
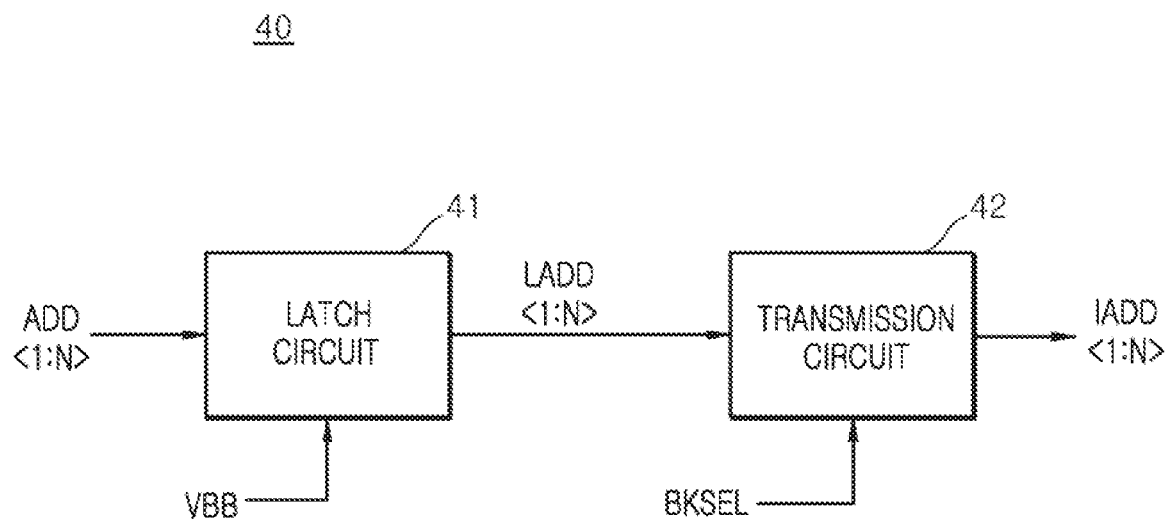
FIG. 6 shows a block diagram illustrating a configuration of an address input circuit included in the semiconductor device of FIG. 1.

Referring to FIG. 6, the address input circuit 40 may include a latch circuit 41 and a transmission circuit 42.

The latch circuit 41 may latch the address ADD<1:N>. The latch circuit 41 may delay the latched signal of the address ADD<1:N> by a second delay time, which is set according to a voltage level of the back-bias voltage VBB, to output the delayed signal of the latched signal of the address ADD<1:N> as a latched address LADD<1:N>. The latch circuit 41 may be realized using a general latch circuit, and a delay time of the latch circuit 41 may increase if the back-bias voltage VBB positively increases.

The transmission circuit 42 may output the latched address LADD<1:N> as the internal address IADD<1:N> in response to the bank selection signal BKSEL. The transmission circuit 42 may output the latched address LADD<1:N> as the internal address IADD<1:N> if the bank selection signal BKSEL is enabled to have a logic "high" level. The transmission circuit 42 may output the latched address LADD<1:N> as the internal address IADD<1:N> during a period that the bank selection signal BKSEL is enabled to have a logic "high" level.

Figure 7:
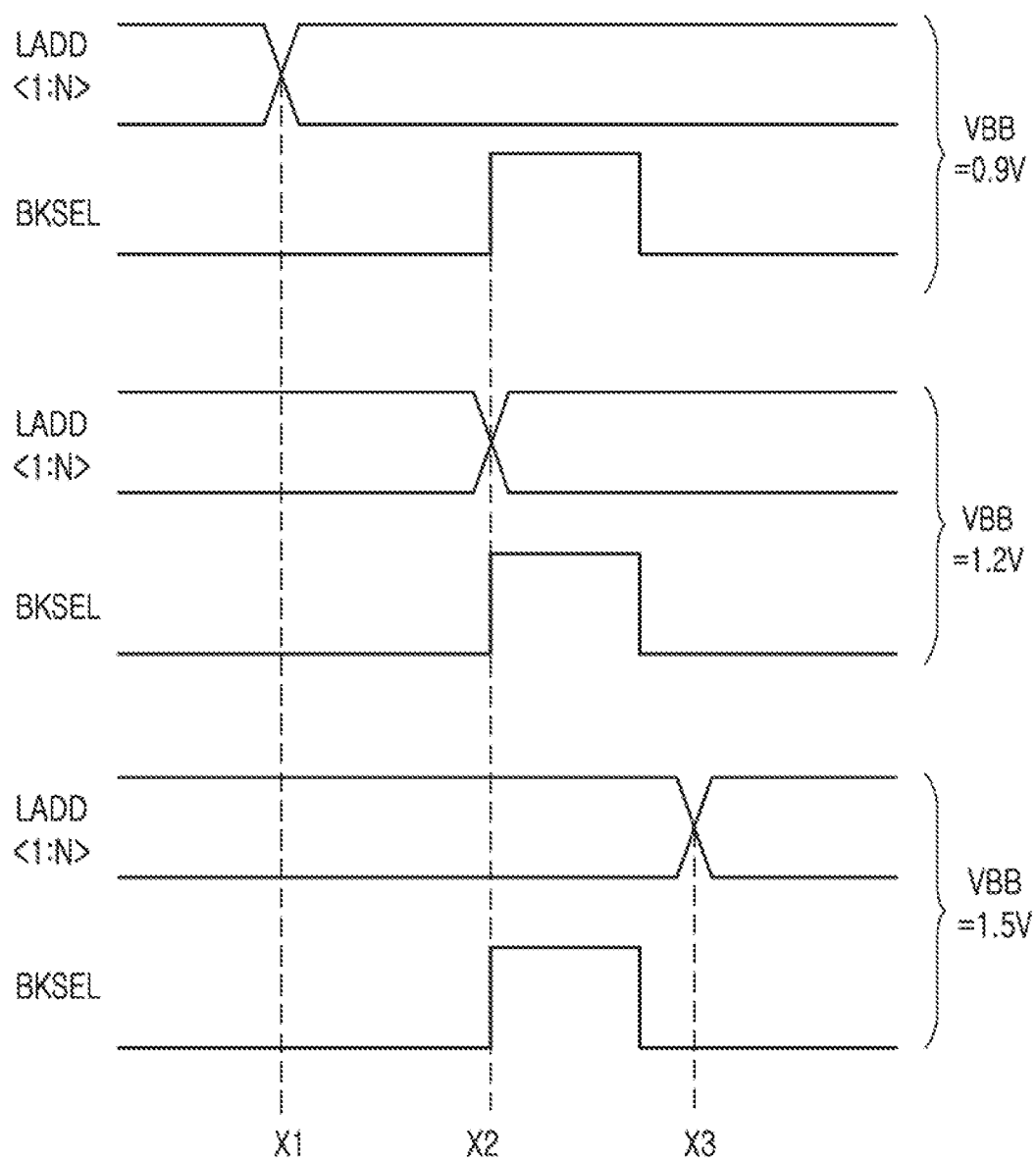
FIGS. 7 and 8 show timing diagrams illustrating operations of a semiconductor device according to an embodiment of the present disclosure.

Generation moments of the latched address LADD<1:N> and the bank selection signal BKSEL for the self-refresh operation without entering a test mode in the power-down mode of the semiconductor device 100 according to an embodiment are described hereinafter with reference to FIG. 7.

First, the self-refresh operation performed when the back-bias voltage VBB of 0.9 volts is generated is described.

The voltage adjustment circuit 10 may generate the back-bias voltage VBB of 0.9 volts in response to the power-down signal PD, which is enabled to have a logic "high" level in order to put the semiconductor device 100 into the power-down mode.

The test mode control circuit 20 may generate the test mode signal TM, which is disabled to have a logic "low" level in response to the power-down signal PD having a logic "high" level and the test enablement signal TMEN having a logic "low" level.

The transmission signal generation circuit 31 of the delay time adjustment circuit 30 may output the active signal BKACT as the first transmission signal TS1 if the test mode signal TM is disabled to have a logic "low" level.

The delay circuit 32 of the delay time adjustment circuit 30 may buffer the first transmission signal TS1 to generate the first delayed signal DS1.

The logic circuit 33 of the delay time adjustment circuit 30 may perform a logical OR operation of the first delayed signal DS1 and the second delayed signal DS2 to generate the bank selection signal BKSEL which is enabled to have a logic "high" level at a point in time "X2."

The latch circuit 41 of the address input circuit 40 may delay a latched signal of the address ADD<1:N> by a second delay time, which is set according to a voltage level of the back-bias voltage VBB, to output the delayed signal of the latched signal of the address ADD<1:N> as the latched address LADD<1:N>. In such a case, the latched address LADD<1:N> may be generated at a point in time "X1."

The transmission circuit 42 of the address input circuit 40 may output the latched address LADD<1:N> as the internal address IADD<1:N> in response to the bank selection signal BKSEL at the point in time "X2."

The core circuit 50 may activate one of a plurality of word lines (not shown) according to the internal address IADD<1:N> to perform the self-refresh operation of memory cells coupled to the activated word line.

Next, the self-refresh operation performed when the back-bias voltage VBB increases to have 1.2 volts is described.

The voltage adjustment circuit 10 may generate the back-bias voltage VBB of 1.2 volts in response to the power-down signal PD which is enabled to have a logic "high" level in order to put the semiconductor device 100 into the power-down mode.

The test mode control circuit 20 may generate the test mode signal TM which is disabled to have a logic "low" level in response to the power-down signal PD having a logic "high" level and the test enablement signal TMEN having a logic "low" level.

The transmission signal generation circuit 31 of the delay time adjustment circuit 30 may output the active signal BKACT as the first transmission signal TS1 if the test mode signal TM is disabled to have a logic "low" level.

The delay circuit 32 of the delay time adjustment circuit 30 may buffer the first transmission signal TS1 to generate the first delayed signal DS1.

The logic circuit 33 of the delay time adjustment circuit 30 may perform a logical OR operation of the first delayed signal DS1 and the second delayed signal DS2 to generate the bank selection signal BKSEL which is enabled to have a logic "high" level at the point in time "X2."

The latch circuit 41 of the address input circuit 40 may delay a latched signal of the address ADD<1:N> by a second delay time, which is greater than the second delay time set when the back-bias voltage VBB is 0.9 volts, to output the delayed signal of the latched signal of the address ADD<1:N> as the latched address LADD<1:N>. In such a case, the latched address LADD<1:N> may be generated at the point in time "X2."

The transmission circuit 42 of the address input circuit 40 may output the latched address LADD<1:N> as the internal address IADD<1:N> in response to the bank selection signal BKSEL at the point in time "X2." In such a case, because the point in time "X2" is a moment when the latched address LADD<1:N> is generated, the internal address IADD<1:N> may be generated from the latched address LADD<1:N> before or after the point in time "X2."

The core circuit 50 may activate one of a plurality of word lines (not shown) according to the internal address IADD<1:N> to perform the self-refresh operation. However, the activated word line may be an undesired word line.

Next, the self-refresh operation performed when the back-bias voltage VBB increases to have 1.5 volts is described.

The voltage adjustment circuit 10 may generate the back-bias voltage VBB of 1.5 volts in response to the power-down signal PD which is enabled to have a logic "high" level in order to put the semiconductor device 100 into the power-down mode.

The test mode control circuit 20 may generate the test mode signal TM which is disabled to have a logic "low" level in response to the power-down signal PD having a logic "high" level and the test enablement signal TMEN having a logic "low" level.

The transmission signal generation circuit 31 of the delay time adjustment circuit 30 may output the active signal BKACT as the first transmission signal TS1 if the test mode signal TM is disabled to have a logic "low" level.

The delay circuit 32 of the delay time adjustment circuit 30 may buffer the first transmission signal TS1 to generate the first delayed signal DS1.

The logic circuit 33 of the delay time adjustment circuit 30 may perform a logical OR operation of the first delayed signal DS1 and the second delayed signal DS2 to generate the bank selection signal BKSEL which is enabled to have a logic "high" level at the point in time "X2."

The latch circuit 41 of the address input circuit 40 may delay a latched signal of the address ADD<1:N> by a second delay time, which is greater than the second delay time set when the back-bias voltage VBB is 1.2 volts, to output the delayed signal of the latched signal of the address ADD<1:N> as the latched address LADD<1:N>. In such a case, the latched address LADD<1:N> may be generated at a point in time "X3."

The transmission circuit 42 of the address input circuit 40 may output the latched address LADD<1:N> as the internal address IADD<1:N> in response to the bank selection signal BKSEL at the point in time "X2." In such a case, because the point in time "X2" is a moment before the latched address LADD<1:N> is generated, the internal address IADD<1:N> may be generated from the latched address LADD<1:N> before the point in time "X3."

The core circuit 50 may activate one of a plurality of word lines (not shown) according to the internal address IADD<1:N> to perform the self-refresh operation. However, the activated word line corresponds to an undesired word line.

As described above, if a voltage level of the back-bias voltage VBB increases out of the test mode during the power-down mode, then the self-refresh operation may be unstably performed due to the delay mismatch between the latched address LADD<1:N> and the bank selection signal BKSEL.

Figure 8:
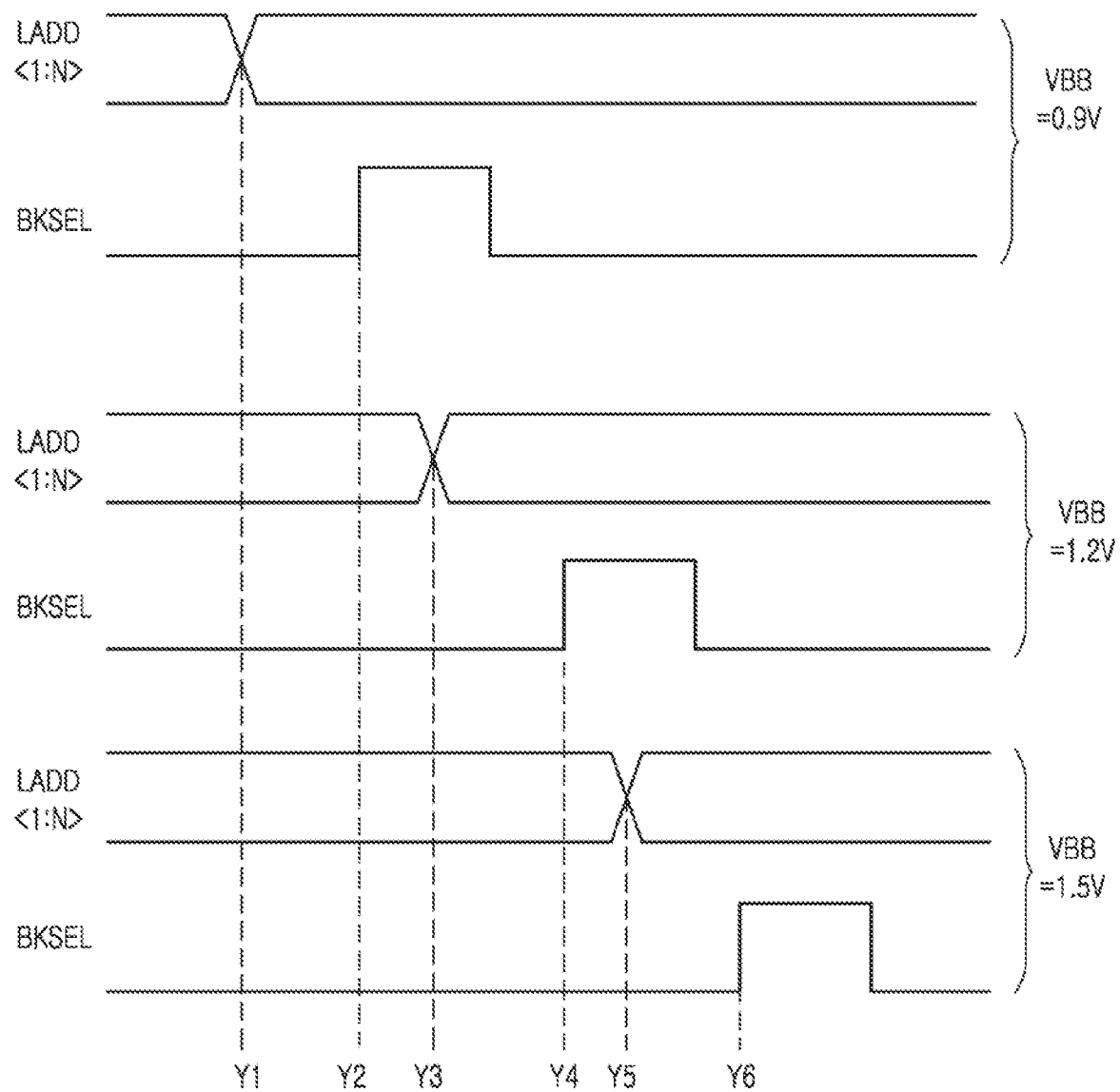

Generation moments of the latched address LADD<1:N> and the bank selection signal BKSEL for the self-refresh operation in a test mode during the power-down mode of the semiconductor device 100 according to an embodiment are described hereinafter with reference to FIG. 8.

First, the self-refresh operation performed when the back-bias voltage VBB of 0.9 volts is generated is described.

The voltage adjustment circuit 10 may generate the back-bias voltage VBB of 0.9 volts in response to the power-down signal PD which is enabled to have a logic "high" level in order to put the semiconductor device 100 into the power-down mode.

The test mode control circuit 20 may generate the test mode signal TM which is enabled to have a logic "high" level in response to the power-down signal PD having a logic "high" level and the test enablement signal TMEN having a logic "high" level.

The transmission signal generation circuit 31 of the delay time adjustment circuit 30 may output the active signal BKACT as the second transmission signal TS2 if the test mode signal TM is enabled to have a logic "high" level.

The delay circuit 32 of the delay time adjustment circuit 30 may delay the second transmission signal TS2 by a first delay time, which is set according to a voltage level of the back-bias voltage VBB, to generate the second delayed signal DS2.

The logic circuit 33 of the delay time adjustment circuit 30 may perform a logical OR operation of the first delayed signal DS1 and the second delayed signal DS2 to generate the bank selection signal BKSEL which is enabled to have a logic "high" level at a point in time "Y2."

The latch circuit 41 of the address input circuit 40 may delay a latched signal of the address ADD<1:N> by a second delay time, which is set according to a voltage level of the back-bias voltage VBB, to output the delayed signal of the latched signal of the address ADD<1:N> as the latched address LADD<1:N>. In such a case, the latched address LADD<1:N> may be generated at a point in time "Y1."

The transmission circuit 42 of the address input circuit 40 may output the latched address LADD<1:N> as the internal address IADD<1:N> in response to the bank selection signal BKSEL at the point in time "Y2."

The core circuit 50 may activate one of a plurality of word lines (not shown) according to the internal address IADD<1:N> to perform the self-refresh operation of memory cells coupled to the activated word line.

Next, the self-refresh operation performed when the back-bias voltage VBB increases to have 1.2 volts is described.

The voltage adjustment circuit 10 may generate the back-bias voltage VBB of 1.2 volts in response to the power-down signal PD which is enabled to have a logic "high" level in order to put the semiconductor device 100 into the power-down mode.

The test mode control circuit 20 may generate the test mode signal TM which is enabled to have a logic "high" level in response to the power-down signal PD having a logic "high" level and the test enablement signal TMEN having a logic "high" level.

The transmission signal generation circuit 31 of the delay time adjustment circuit 30 may output the active signal BKACT as the second transmission signal TS2 if the test mode signal TM is enabled to have a logic "high" level.

The delay circuit 32 of the delay time adjustment circuit 30 may delay the second transmission signal TS2 by a first delay time, which is greater than the first delay time set when the back-bias voltage VBB is 0.9 volts, to generate the second delayed signal DS2.

The logic circuit 33 of the delay time adjustment circuit 30 may perform a logical OR operation of the first delayed signal DS1 and the second delayed signal DS2 to generate the bank selection signal BKSEL which is enabled to have a logic "high" level at a point in time "Y4."

The latch circuit 41 of the address input circuit 40 may delay a latched signal of the address ADD<1:N> by a second delay time, which is greater than the second delay time set when the back-bias voltage VBB is 0.9 volts, to output the delayed signal of the latched signal of the address ADD<1:N> as the latched address LADD<1:N>. In such a case, the latched address LADD<1:N> may be generated at a point in time "Y3."

The transmission circuit 42 of the address input circuit 40 may output the latched address LADD<1:N> as the internal address IADD<1:N> in response to the bank selection signal BKSEL at the point in time "Y4." In such a case, the internal address IADD<1:N> may be generated from the latched address LADD<1:N> after the point in time "Y3."

The core circuit 50 may activate one of a plurality of word lines (not shown) according to the internal address IADD<1:N> to perform the self-refresh operation of memory cells coupled to the activated word line.

Next, the self-refresh operation performed when the back-bias voltage VBB increases to have 1.5 volts is described.

The voltage adjustment circuit 10 may generate the back-bias voltage VBB of 1.5 volts in response to the power-down signal PD which is enabled to have a logic "high" level in order to put the semiconductor device 100 into the power-down mode.

The test mode control circuit 20 may generate the test mode signal TM which is enabled to have a logic "high" level in response to the power-down signal PD having a logic "high" level and the test enablement signal TMEN having a logic "high" level.

The transmission signal generation circuit 31 of the delay time adjustment circuit 30 may output the active signal BKACT as the second transmission signal TS2 if the test mode signal TM is enabled to have a logic "high" level.

The delay circuit 32 of the delay time adjustment circuit 30 may delay the second transmission signal TS2 by a first delay time, which is greater than the first delay time set when the back-bias voltage VBB is 1.2 volts, to generate the second delayed signal DS2.

The logic circuit 33 of the delay time adjustment circuit 30 may perform a logical OR operation of the first delayed signal DS1 and the second delayed signal DS2 to generate the bank selection signal BKSEL which is enabled to have a logic "high" level at a point in time "Y6."

The latch circuit 41 of the address input circuit 40 may delay a latched signal of the address ADD<1:N> by a second delay time, which is greater than the second delay time set when the back-bias voltage VBB is 1.2 volts, to output the delayed signal of the latched signal of the address ADD<1:N> as the latched address LADD<1:N>. In such a case, the latched address LADD<1:N> may be generated at a point in time "Y5."

The transmission circuit 42 of the address input circuit 40 may output the latched address LADD<1:N> as the internal address IADD<1:N> in response to the bank selection signal BKSEL at the point in time "Y6." In such a case, the internal address IADD<1:N> may be generated from the latched address LADD<1:N> after the point in time "Y5."

The core circuit 50 may activate one of a plurality of word lines (not shown) according to the internal address IADD<1:N> to perform the self-refresh operation of memory cells coupled to the activated word line.

As described above, if a voltage level of the back-bias voltage VBB increases in the test mode during the power-down mode, then the self-refresh operation may be stably performed because the delay times of the latched address LADD<1:N> and the bank selection signal BKSEL are appropriately matched.

Figure 9:
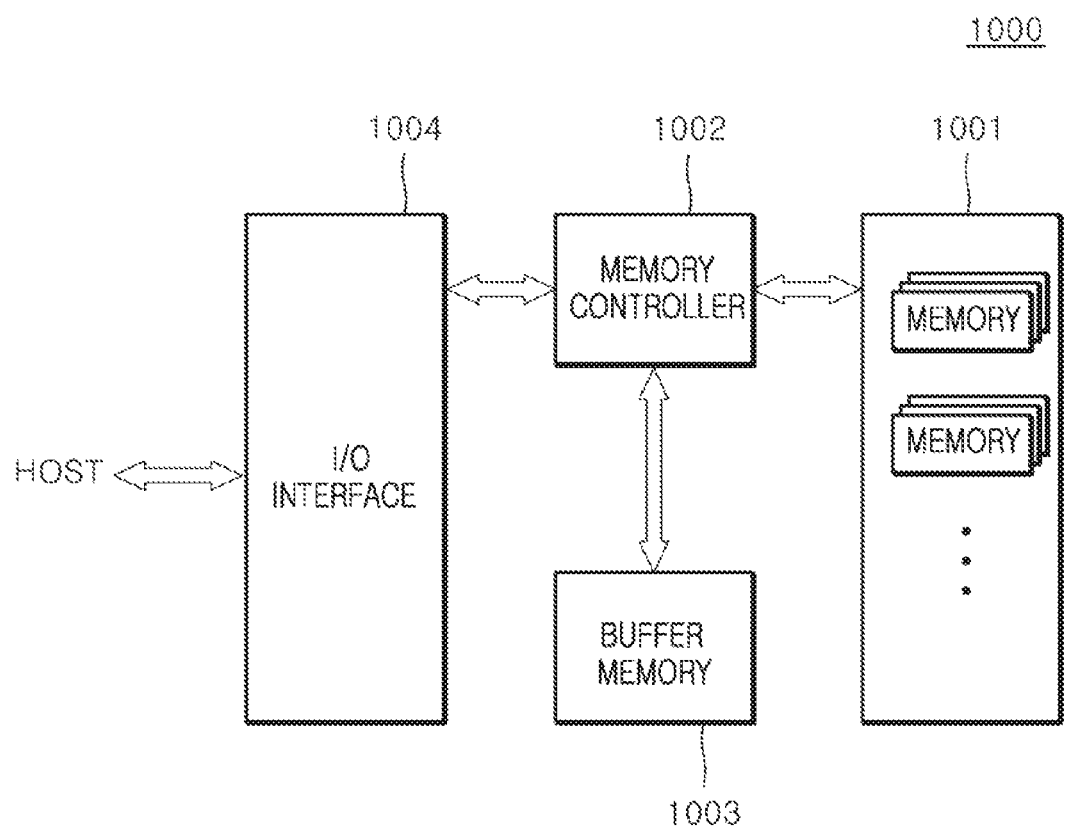
FIG. 9 shows a block diagram illustrating an electronic system including the semiconductor device shown in FIGS. 1 to 8.

The semiconductor device 100 described with reference to FIGS. 1 to 8 may be applied to an electronic system which includes a memory system, a graphic system, a computing system, a mobile system, or the like. For example, as illustrated in FIG. 9, an electronic system 1000 according an embodiment may include a data storage unit 1001, a memory controller 1002, a buffer memory 1003, and an input/output (I/O) interface 1004.

The data storage unit 1001 may store data which are outputted from the memory controller 1002 or may read and output the stored data to the memory controller 1002, according to a control signal generated from the memory controller 1002. The data storage unit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage unit 1001 or the buffer memory 1003 or for outputting the data stored in the data storage unit 1001 or the buffer memory 1003. Although FIG. 9 illustrates the memory controller 1002 with a single block, the memory controller 1002 may include one controller for controlling the data storage unit 1001, which includes nonvolatile memory, and another controller for controlling the buffer memory 1003, which includes volatile memory.

The buffer memory 1003 may temporarily store the data to be processed by the memory controller 1002. That is, the buffer memory 1003 may temporarily store the data which are outputted from or to be inputted to the data storage unit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM). The buffer memory 1003 may include the semiconductor device 100 illustrated in FIG. 1.

The I/O interface 1004 may physically and electrically connect the memory controller 1002 to an external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. For some embodiments, the I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. For some embodiments, the electronic system 1000 may include a solid state disk (SSD), a USB memory, a secure digital (SD) card, a mini secure digital (mSD) card, a micro secure digital (micro SD) card, a secure digital high capacity (SDRC) card, a memory stick card, a smart media (SM) card, a multi-media card (MMC), an embedded multi-media card (eMMC), a compact flash (CF) card, or the like.

What is claimed is:

1. A semiconductor device comprising:
   a delay time adjustment circuit configured to adjust a point in time when charges are supplied to internal nodes according to a voltage level of a back-bias voltage in response to a test mode signal and configured to delay an active signal by a first delay time varying according to amounts of charge of the internal nodes to generate a bank selection signal; and
   an address input circuit configured to be driven by the back-bias voltage, configured to receive an address in response to the bank selection signal to generate an internal address, and configured to delay the address by a second delay time varying according to a voltage level of the back-bias voltage.

2. The semiconductor device of claim 1, wherein the first delay time and the second delay time increase in proportion to a voltage level of the back-bias voltage.

3. The semiconductor device of claim 1, wherein a voltage level of the back-bias voltage increases in a power-down mode.

4. The semiconductor device of claim 1, wherein the address is sequentially counted during a self-refresh operation in a power-down mode.

5. The semiconductor device of claim 1, wherein the delay time adjustment circuit comprises:
   a transmission signal generation circuit configured to output the active signal as a first transmission signal or a second transmission signal in response to the test mode signal;
   a delay circuit configured to delay the first transmission signal by a predetermined delay time to generate a first delayed signal and configured to delay the second transmission signal by the first delay time, which is set according to a voltage level of the back-bias voltage, to generate a second delayed signal; and
   a logic circuit configured to generate the bank selection signal which is enabled when any one of the first and second delay signals is generated.

6. The semiconductor device of claim 5, wherein the delay circuit comprises:
   a first delay circuit configured to delay the first transmission signal by a predetermined delay time to generate the first delayed signal; and
   a second delay circuit configured to delay the second transmission signal by the first delay time, which is set according to a voltage level of the back-bias voltage, to generate the second delayed signal.

7. The semiconductor device of claim 6,
   wherein the internal nodes comprise a first internal node and a second internal node; and
   wherein the second delay circuit comprises:
   a first buffer configured to inversely delay the second transmission signal to output the inversely delayed signal of the second transmission signal to the first internal node;
   a first charge supply circuit connected to the first internal node to control a charging time of the first internal node according to the back-bias voltage;
   a second buffer configured to inversely delay a signal of the first internal node to output the inversely delayed signal of the signal of the first internal node to the second internal node through which the second delayed signal is outputted; and a second charge supply circuit connected to the second internal node to control a charging time of the second internal node according to the back-bias voltage.

8. The semiconductor device of claim 7,
wherein the back-bias voltage is used as a body voltage of the first and second charge supply circuits; and
wherein each of the first and second charge supply circuits comprises a MOS transistor-type capacitor whose turn-on voltage increases when the back-bias voltage increases.

9. The semiconductor device of claim 1, wherein the address input circuit comprises:
a latch circuit configured to latch the address and configured to delay the latched signal of the address by the second delay time to output the delayed latched signal as a latched address, wherein the second delay time is set according to a voltage level of the back-bias voltage; and
a transmission circuit configured to output the latched address as the internal address in response to the bank selection signal.

10. The semiconductor device of claim 1, further comprising:
a voltage adjustment circuit configured to adjust a voltage level of the back-bias voltage in response to a power-down signal, wherein the power-down signal is enabled in a power-down mode;
a test mode control circuit configured to generate the test mode signal, wherein the test mode signal is enabled if the power-down signal and a test enablement signal are enabled; and
a core circuit configured to include a plurality of word lines, configured to receive the internal address generated by the address input circuit, and configured to activate one of the plurality of word lines in response to the received internal address to perform a self-refresh operation for the activated word line.

11. The semiconductor device of claim 10, wherein the test enablement signal is enabled to put the semiconductor device in a test mode for adjusting a point in time when the bank selection signal is generated in the power-down mode.

12. A semiconductor device comprising
a delay time adjustment circuit configured to delay a point in time when charges are supplied to internal nodes in response to a back-bias voltage whose voltage level increases in a power-down mode and configured to delay an active signal by a first delay time varying according to amounts of charge of the internal nodes to generate a bank selection signal; and
an address input circuit configured to be driven by the back-bias voltage, configured to receive an address in response to the bank selection signal to generate an internal address, and configured to delay the address by a second delay time varying according to a voltage level of the back-bias voltage.

13. The semiconductor device of claim 12, wherein the first delay time and the second delay time increase in proportion to a voltage level of the back-bias voltage.

14. The semiconductor device of claim 1, wherein the delay time adjustment circuit comprises:
a transmission signal generation circuit configured to output the active signal as a first transmission signal or a second transmission signal in response to a test mode signal;
a delay circuit configured to delay the first transmission signal by a predetermined delay time to generate a first delayed signal and configured to delay the second transmission signal by the first delay time, which is set according to a voltage level of the back-bias voltage, to generate a second delayed signal; and
a logic circuit configured to generate the bank selection signal which is enabled when any one of the first and second delay signals is generated.

15. The semiconductor device of claim 14, wherein the test mode signal is enabled to put the semiconductor device in a test mode for controlling a point in time when the bank selection signal is generated in the power-down mode.

16. The semiconductor device of claim 14, wherein the delay circuit comprises:
a first delay circuit configured to delay the first transmission signal by a predetermined delay time to generate the first delayed signal; and
a second delay circuit configured to delay the second transmission signal by the first delay time, which is set according to a voltage level of the back-bias voltage, to generate the second delayed signal.

17. The semiconductor device of claim 16,
wherein the internal nodes comprise a first internal node and a second internal node; and
wherein the second delay circuit comprises:
a first buffer configured to inversely delay the second transmission signal to output the inversely delayed signal of the second transmission signal to the first internal node;
a first charge supply circuit connected to the first internal node to control a charging time of the first internal node according to the back-bias voltage;
a second buffer configured to inversely delay a signal of the first internal node to output the inversely delayed signal of the signal of the first internal node to the second internal node through which the second delayed signal is outputted; and
a second charge supply circuit connected to the second internal node to control a charging time of the second internal node according to the back-bias voltage.

18. The semiconductor device of claim 17,
wherein the back-bias voltage is used as a body voltage of the first and second charge supply circuits; and
wherein each of the first and second charge supply circuits comprises a MOS transistor-type capacitor whose turn-on voltage increases when the back-bias voltage increases.

19. The semiconductor device of claim 12, wherein the address input circuit comprises:
a latch circuit configured to latch the address and configured to delay the latched signal of the address by the second delay time to output the delayed latched signal as a latched address, wherein the second delay time is set according to a voltage level of the back-bias voltage; and
a transmission circuit configured to output the latched address as the internal address in response to the bank selection signal.

20. A semiconductor device comprising:
a delay time adjustment circuit configured to delay, in response to a test mode signal, an active signal by a first delay time varying according to a voltage level of a back-bias voltage to generate a bank selection signal; and
an address input circuit configured to be driven by the back-bias voltage, configured to receive an address in response to the bank selection signal to generate an internal address, and configured to delay the address by a second delay time varying according to a voltage level of the back-bias voltage.

\* \* \* \* \*